(12) United States Patent
Kim

(10) Patent No.: US 7,751,995 B2
(45) Date of Patent: Jul. 6, 2010

(54) CAPACITANCE MEASUREMENT METHOD EMPLOYING FLOATING GATE OF SEMICONDUCTOR DEVICE

(75) Inventor: Jong Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 299 days.

(21) Appl. No.: 11/830,210

(22) Filed: Jul. 30, 2007

(65) Prior Publication Data
US 2008/0059090 A1   Mar. 6, 2008

(30) Foreign Application Priority Data
Aug. 30, 2006   (KR) .................. 10-2006-0083064

(51) Int. Cl.
*G01R 5/28* (2006.01)
(52) U.S. Cl. .................. 702/64; 702/65; 702/179; 702/182
(58) Field of Classification Search .............. 702/64, 702/65, 99, 102, 127, 130, 132; 365/100, 365/185.19; 438/259; 713/600
See application file for complete search history.

(56) References Cited

U.S. PATENT DOCUMENTS 5,825,063 A * 10/1998 Diorio et al. ............. 713/600
6,172,908 B1 * 1/2001 Cappelletti et al. ........ 365/185.19
7,269,046 B2 * 9/2007 Graham et al. ............. 365/100

OTHER PUBLICATIONS

C. Kortekaas, On-chip Quasi-static Floating-gate Capacitance Measurement Method, Mar. 1990, Proc. IEEE 1990 Int. Conference on Microelectronic Test Structures, vol. 3, pp. 109-113.*

* cited by examiner

*Primary Examiner*—Hal D Wachsman
*Assistant Examiner*—Felix E Suarez
(74) *Attorney, Agent, or Firm*—Lowe Hauptman Ham & Berner LLP

(57) ABSTRACT

A capacitance measurement method employing a floating gate of a semiconductor device in a circuit having a MOSFET in which a drain is connected to a ground and a source and a gate are connected to each other, and a capacitor having a capacitance $C_r$ connected to the gate, includes: obtaining a slope S from a relationship between voltage $V_s$ of the source and a voltage $V_f$ applied to the capacitor; setting a standard slope $S_0$ as a y-intercept of a first-order linear equation obtained from a relationship between the slope S depending on the source current $I_s$ and the $V_o(I_s)$; and calculating a gate-to-drain overlap capacitance $C_{dgo}$ of the MOSFET based on a capacitance $C_r$ of the capacitor and the standard slop $S_0$.

7 Claims, 6 Drawing Sheets

CAPACITANCE MEASUREMENT METHOD EMPLOYING FLOATING GATE OF SEMICONDUCTOR DEVICE

FIELD OF THE INVENTION

The present invention relates, in general, to a capacitance measurement method and more particularly, to a capacitance measurement method employing a floating gate of a semiconductor device.

BACKGROUND OF THE INVENTION

Presently, evaluation of the interconnect capacitance might take parasitic effects and requires a technique capable of handling complicated test equipment. To the contrary, quasi DC measurement structures provide several methods of evaluating the interconnect capacitance at a narrow test area. A floating gate capacitance measurement method is one of the methods. [C. Kortekaas, "on-chip Quasi-static Floating-gate capacitance Measurement Method", Proc. IEEE Int. Conf. ON Microelectronic Test Structures, pp. 109-113, Vol 3, March 1990]

FIG. 1 is an equivalent circuit diagram of a floating gate structure. The floating gate structure includes one MOSFET M and two first and second capacitors $C_r$ and $C_m$. The first capacitor $C_r$ is a reference capacitance, and the second capacitor $C_m$ is a capacitance to be measured. For example, the MOSFET M (P-channel MOSFET) can be a sense transistor, and can have a drain connected to the ground and a source and a bulk set to the same potential. This construction can prevent variation in the threshold voltage, which is caused by the potential between the source and the bulk. Further, the first capacitor $C_r$ has one end connected to voltage $V_f$, and the second capacitor $C_m$ is connected to a ground gnd.

In the prior art, the capacitance measurement method is performed by measuring a voltage $V_s$ depending on the voltage $V_f$ while constantly supplying current to the MOSFET M in a saturation region $(-V_{ds} > -V_{gs} + V_t)$. Of course, in the case of an N-channel MOSFET, a voltage $-V_s$ depending on a voltage $-V_f$ can be measured while constantly supplying current to the MOSFET in a saturation region $(V_{ds} > V_{gs} + V_t)$.

In this case, the voltage $V_s$ connected to the source of the MOSFET M varies as much as variation in the voltage at the floating gate due to a source-follower characteristic. Consequently, in the $V_f$-$V_s$ relationship graph, the slope between $V_f$-$V_s$ depends on the first capacitor $C_r$ and the second capacitor $C_m$:

$$V_s = S * V_f + V_o(I),  \quad \text{Equation 1}$$

where $S = C_r/(C_r + C_m)$, and $V_o(I)$ indicates the voltage of the source node when current of 1 ampere is applied to the MOSFET when $V_f$ is 0 Volts.

The capacitance of the second capacitor $C_m$, which will be measured according to Equation 1 and a slope formula, can be expressed as $C_m = (1-S)/S * C_r$.

However, when employing the source-flower characteristic of the MOSFET, a charge effect at the floating gate node, which is caused by the gate-to-drain overlap capacitance depending on variation in the voltage between the drain and the floating gate node, is not taken into consideration. That is, the influence of the overlap capacitance between the gate and the drain is not taken into consideration. Accordingly, a measured capacitance could be erroneous, in that, it has an error caused by the gate-to-drain overlap capacitance.

SUMMARY OF THE INVENTION

It is, therefore, an object of the present invention to provide a capacitance measurement method employing a floating gate of a semiconductor device, in which when measuring an interconnect capacitance by using a reference capacitance and a source-follower MOSFET, the influence by the gate-to-drain overlap capacitance can be minimized.

It is another object of the present invention to provide a capacitance measurement method employing a floating gate of a semiconductor device, in which an overlap capacitance of the gate-drain and the gate-source can be measured.

It is yet another object of the present invention to provide a capacitance measurement method employing a floating gate of a semiconductor device, in which when a gate-to-drain overlap capacitance is known, an unknown capacitance connected to a floating gate can be measured based on the known gate-to-drain overlap capacitance.

It is yet another object of the present invention to provide a capacitance measurement method employing a floating gate of a semiconductor device, in which when two known capacitances are connected to a floating gate, a mismatching characteristic between the two capacitances can be analyzed.

In accordance with a first embodiment of the present invention, there is provided a capacitance measurement method employing a floating gate of a semiconductor device in a circuit having a MOSFET in which a drain is connected to a ground and a source and a gate are connected to each other, and a capacitor having a capacitance $C_r$ connected to the gate, the method including: measuring a voltage $V_s$ of the source by applying a voltage $V_f$ to the capacitor in a state where a static current $I_s$ is applied to the source of the MOSFET; setting the voltage $V_s$ when the voltage $V_f$ is zero to $V_o(I_s)$, and obtaining a slope S from a relationship between the voltage $V_s$ and the voltage $V_f$; setting a standard slope $S_0$ as a y-intercept of a first-order linear equation obtained from a relationship between the slope S depending on the source current $I_s$ and the $V_o(I_s)$; and calculating a gate-to-drain overlap capacitance $C_{dgo}$ of the MOSFET based on a capacitance $C_r$ of the capacitor and the standard slop $S_0$.

In accordance with a second embodiment of the present invention, there is provided a capacitance measurement method employing a floating gate of a semiconductor device in a circuit having a MOSFET in which a drain is connected to a ground and a source and a gate are connected to each other, a reference capacitor having a capacitance $C_r$ connected to the gate, and a measurement capacitor having a capacitance $C_m$ connected to the reference capacitor, wherein a node between the reference capacitor and one end of the measurement capacitor is connected to the gate of the MOSFET, and the other end of the measurement capacitor is connected to the ground, the method including:

measuring a voltage $V_s$ of the source by applying a voltage $V_f$ to the reference capacitor to which the measurement capacitor is connected in a state where a static current $I_s$ is applied to the source of the MOSFET; setting the voltage $V_s$ when the voltage $V_f$ is zero to $V_o(I_s)$, and obtaining a slope S from a relationship between the voltage $V_s$ and the voltage $V_f$; setting a standard slope $S_1$ as a y-intercept of a first-order linear equation obtained from a relationship between the slope S depending on the source current $I_s$ and the $V_o(I_s)$; removing the measurement capacitor from the circuit; measuring a voltage $V_s'$ of the source by applying the voltage $V_f$ to the reference capacitor in a state where the static current $I_s$ is applied to the source of the MOSFET; setting the voltage $V_s'$ when the voltage $V_f$ is zero to $V_o'$ ($I_s$), and obtaining a slope S' from a relationship between the voltage $V_s'$ and the voltage $V_f$; setting a standard slope $S_0$ as a y-intercept of a first-order linear equation obtained from a relationship between the slope S' depending on the source current $I_s$ and the $V_o'$ ($I_s$); and calculating the capacitance $C_m$ of the measurement capacitor.

In accordance with a third embodiment of the present invention, there is provided a capacitance measurement method employing a floating gate of a semiconductor device in a circuit having a MOSFET in which a drain is connected to a ground and, a source and a gate are connected to each other, and a first capacitor having a capacitance $C_r$ connected to the gate, and a second capacitor having a capacitance $C_m$ connected to the first capacitor, wherein a node between the first capacitor and one end of the second capacitor is connected to the gate of the MOSFET, and the other end of the second capacitor is connected to the ground, the method including: measuring a voltage $V_s$ of the source by applying a voltage $V_f$ to the first capacitor to which the second capacitor is connected in a state where a static current $I_s$ is applied to the source of the MOSFET; setting the voltage $V_s$ when the voltage $V_f$ is zero to $V_o(I_s)$, and obtaining a slope S from a relationship between the voltage $V_s$ and the voltage $V_f$; setting a standard slope $S_1$ as a y-intercept of a first-order linear equation obtained from a relationship between the slope S depending on the source current $I_s$ and the $V_o(I_s)$; removing the second capacitor from the circuit; measuring a voltage $V_s'$ of the source by applying the voltage $V_f$ to the first capacitor in a state where the static current $I_s$ is applied to the source of the MOSFET; setting the voltage $V_s'$ when the voltage $V_f$ is zero to $V_o'$ ($I_s$), and obtaining a slope S' from a relationship between the voltage $V_s'$ and the voltage $V_f$; setting a standard slope $S_0$ as a y-intercept of a first-order linear equation obtained from a relationship between the slope S' depending on the source current $I_s$ and the $V_o'$ ($I_s$); and analyzing a mismatching characteristic between the first and the second capacitor based on the standard slopes $S_0$ and $S_1$.

As described above, the present invention can minimize the effect of the gate-to-drain overlap capacitance when measuring an interconnect capacitance by using a reference capacitance and a source-flower MOSFET. Of course, a lower capacitance can be measured, measurement resolutions of a capacitor to be measured can be improved, and a test pattern area of a small MOSFET can be reduced. Furthermore, a MOSFET having a high overlap capacitance of a gate-drain/the gate-source can also be used for measurement.

Further, an overlap capacitance of the gate-drain and the gate-source can be measured.

Further, in accordance with the present invention, when a gate-to-drain overlap capacitance is known, an unknown capacitance connected to a floating gate can be measured based on the known gate-to-drain overlap capacitance.

Furthermore, according to the present invention, when two known capacitances are connected to a floating gate, a mismatching characteristic between the two capacitances can be analyzed.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described in detail with reference to the accompanying drawings so that they can be readily understood by those skilled in the art.

Figure 1:
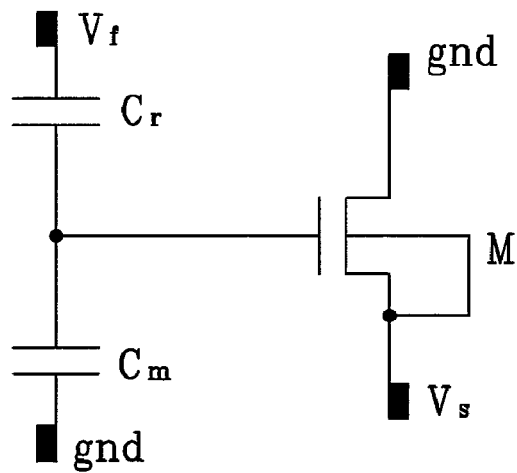
FIG. 1 is an equivalent circuit diagram of a floating gate structure having a reference capacitance and an unknown capacitance.

FIG. 1 is an equivalent circuit diagram of a floating gate structure having a reference capacitance and an unknown capacitance.

In FIG. 1, even if the voltage $V_f$ applied to the reference capacitor $C_r$ or the voltage applied to the drain or the source of the MOSFET M changes and, if there is no current induced from another node to the floating gate node and the amount of current, which is generated and becomes distinct within the floating gate node is negligible, the floating gate node will be in a neutral condition, that is, at an initial value, a total amount of internal charge is 0. In other words, it is considered that the charge amount of the floating gate node is unchanged. It can be expressed in Equation 2. This condition infers that $V_g(t)$ is constant as time goes by (i.e., $V_g(t)$=$V_g$).

$$\text{Integ}(I,t) = C_r^*(V_g(t)-V_f) + C_m^*V_g(t) + C_{dgo}^*(V_g(t)-V_d) + C_{sgo}^*(V_g(t)-V_s) + C_{bgo}^*(V_g(t)-V_s) = 0, \quad \text{Equation 2}$$

where $V_g(t)$ indicates the voltage of the floating gate node. Further, $C_{dgo}$ indicates a gate-to-drain overlap capacitance, $C_{sgo}$ indicates a gate-to-source overlap capacitance, and $C_{bgo}$ indicates a gate-to-bulk overlap capacitance.

Furthermore, $V_d$=ground=0, and $V_g(t)$–$V_{th}$=$V_s$ from the source-follower characteristic. $V_{th}$ is the threshold voltage. If the measurement condition is applied to Equation 2, Equation 2 can be arranged to become Equation 3:

$$C_r^*(V_s+V_{th}-V_f) + C_m^*(V_s+V_{th}) + C_{dgo}^*(V_s+V_{th}-V_d) + C_{sgo}^*(V_{th}) + C_{bgo}^*(V_{th}) = 0. \quad \text{Equation 3}$$

If Equation 3 is differentiated with respect to the voltage $V_f$, $dV_{th}/dV_f$=0 since the threshold voltage $V_{th}$ is a constant. Assuming that $dV_s/dV_f$=S, Equation 4 is obtained:

$$C_r^*(S-1) + C_m^*S + C_{dgo}^*S = 0. \quad \text{Equation 4}$$

As shown in Equation 4, the slope is influenced by the gate-to-drain overlap capacitance in the relationship graph between the voltage $V_s$ and the voltage $V_f$. In this case, the influence of the gate-to-drain overlap capacitance can be negligible when the capacitance $C_r$ for the reference capacitor and the capacitance $C_m$ for the measurement capacitor are much higher than the gate-to-drain overlap capacitance $C_{dgo}$, but cannot be negligible when the capacitance $C_r$ for the reference capacitor and the capacitance $C_m$ for the measurement capacitor are not much higher than the gate-to-drain overlap capacitance $C_{dgo}$.

In other words, it can be seen that the gate-to-drain overlap capacitance has an effect on measurement resolutions of the measurement capacitor. In other words, it is meant that if the gate-to-drain overlap capacitance $C_{dgo}$ is not negligible, the measurement resolutions can be improved.

Further, $dV_s/dV_f$ is influenced by a current to be measured due to variation in the charges in the channel region of the MOSFET M according to the static current $I_s$ applied to measure the voltage $V_s$.

A method of removing the influence and measuring the slope accurately is described below.

1. The drain node of the MOSFET M is set to the ground and the static current $I_s$ is applied to a node connected to the source and the bulk. When the voltage $V_f$ is 0, the voltage $V_s$ of the source is measured to obtain $V_o(I_s)$. A slope $S(I_s)$ is obtained by measuring the source voltage $V_s$ while changing the voltage $V_f$.

2. $V_o(I_s)$ and the slope $S(I_s)$ depending on each $I_s$ are measured while changing the source current $I_s$.

3. After, $V_o(I_s)$ depending on the source current $I_s$ is placed in an X axis and the slope $S(I_s)$ is placed in a Y axis, the Y axis from a linear trend line and the slope value of an intercept thereof are set to a standard slope $S_n$ of the structure.

Figure 2:
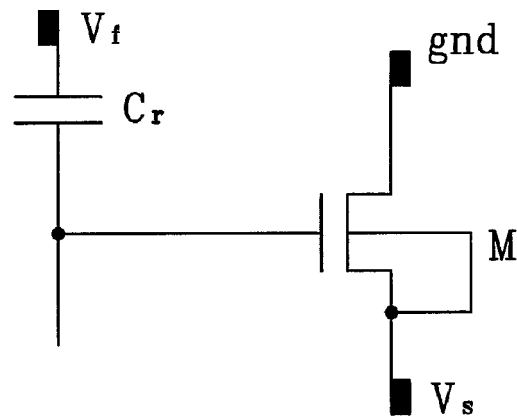
FIG. 2 is an equivalent circuit diagram of a floating gate structure when one terminal of an unknown capacitor is opened from the ground.

In a case where one capacitor is connected to the floating gate, i.e., where one capacitor $C_r$ is connected to the floating gate of the MOSFET M, as illustrated in FIG. 2.

A measurement method is as follows:

In the circuit structure, a standard slope $S_0$ is measured by the above method of measuring the slope S. Thereafter, if one of the gate-to-drain overlap capacitance $C_{dgo}$ and the capacitance $C_r$ of the capacitor is known, the other of the gate-to-drain overlap capacitance $C_{dgo}$ and the capacitance $C_r$ of the capacitor can be known from Equation 5:

$$C_{dgo} = [(1-S_0)/S_0]*C_r \qquad \text{Equation 5}$$

That is, the gate-to-drain overlap capacitance $C_{dgo}$ can be calculated when the capacitance $C_r$ is known.

In a case where two capacitors are connected to the floating gate, i.e., where a reference capacitor $C_r$ and a measurement capacitor $C_m$ are connected to the floating gate of the MOSFET M, as illustrated in FIG. 1.

A measurement method is as follows:

The terminal of the measurement capacitor $C_m$ is opened and connected in the same manner as that one capacitor $C_r$ is connected to the floating gate. The standard slope $S_0$ is measured by the above method of measuring the slope S of the structure.

While the terminal of the capacitor $C_m$ is connected to the ground, a standard slope $S_1$ is measured by the above method of measuring the slope S.

The capacitance $C_m$ of the measurement capacitor can be known, if the capacitance $C_r$ of the reference capacitor is known, from Equation 6 or 7:

$$C_m = [(1-S_1)/S_1]*C_r - C_{dgo}, \text{ and} \qquad \text{Equation 6}$$

$$C_m = (1/S_1 - 1/S_0)*C_r. \qquad \text{Equation 7}$$

In Equation 6, the capacitance $C_m$ of the measurement capacitor can be measured when the drain-to-gate overlap capacitance is known.

Method of analyzing matching characteristic of capacitance, i.e., where two capacitors are connected to the floating gate, as illustrated in FIG. 1. In this case, it is determined whether the two capacitors have the same value.

If the slopes $S_1$ and $S_0$ are measured by the above methods, the ratio of the values of the two capacitors can be calculated from Equation 8:

$$R = C_m/C_r = 1/S_1 - 1/S_0. \qquad \text{Equation 8}$$

In other words, it can be said that when the values approach 1, the two capacitors have the same value. That is, mismatching characteristic between the two capacitances can be analyzed.

In order to verify the above method, a 2D-numerical device simulator, that is, Technology Computer-Aided Design (TCAD) software for analyzing the electrical characteristics of a device based on a physical model was used.

Three test cases having three different capacitances $C_m$ with respect to the same capacitance $C_r$ are listed in Table 1. Respective capacitor values were obtained by using the 2D-numerical device simulator.

TABLE 1

| Cases | Capacitance (fF) by 2-D numerical calculation |
|---|---|
| Capacitance $C_r$ | 1.922 |
| Capacitance $C_{m1}$ | 1.804 |
| Capacitance $C_{m2}$ | 0.637 |
| Capacitance $C_{m3}$ | 0.396 |
| Gate-to-drain overlap capacitance $C_{dgo}$ | 0.339 |

The evaluation of the capacitances by the conventional method and the method disclosed in the present invention are listed in the following table 2.

TABLE 2

| Case | Ratio (real) | Ratio (ext) | Ratio (old) | Ratio (ext) | Error (old) |
|---|---|---|---|---|---|
| $C_{m1}/C_r$ | 0.939 | 0.937 | 1.141 | 0.221 | 21.579 |
| $C_{m2}/C_r$ | 0.332 | 0.330 | 0.527 | 0.508 | 58.838 |
| $C_{m3}/C_r$ | 0.206 | 0.205 | 0.399 | 0.268 | 93.677 |
| $C_{dgo}/C_r$ | 0.176 | 0.179 | 0.192 | 1.406 | 8.815 |

Figure 3:
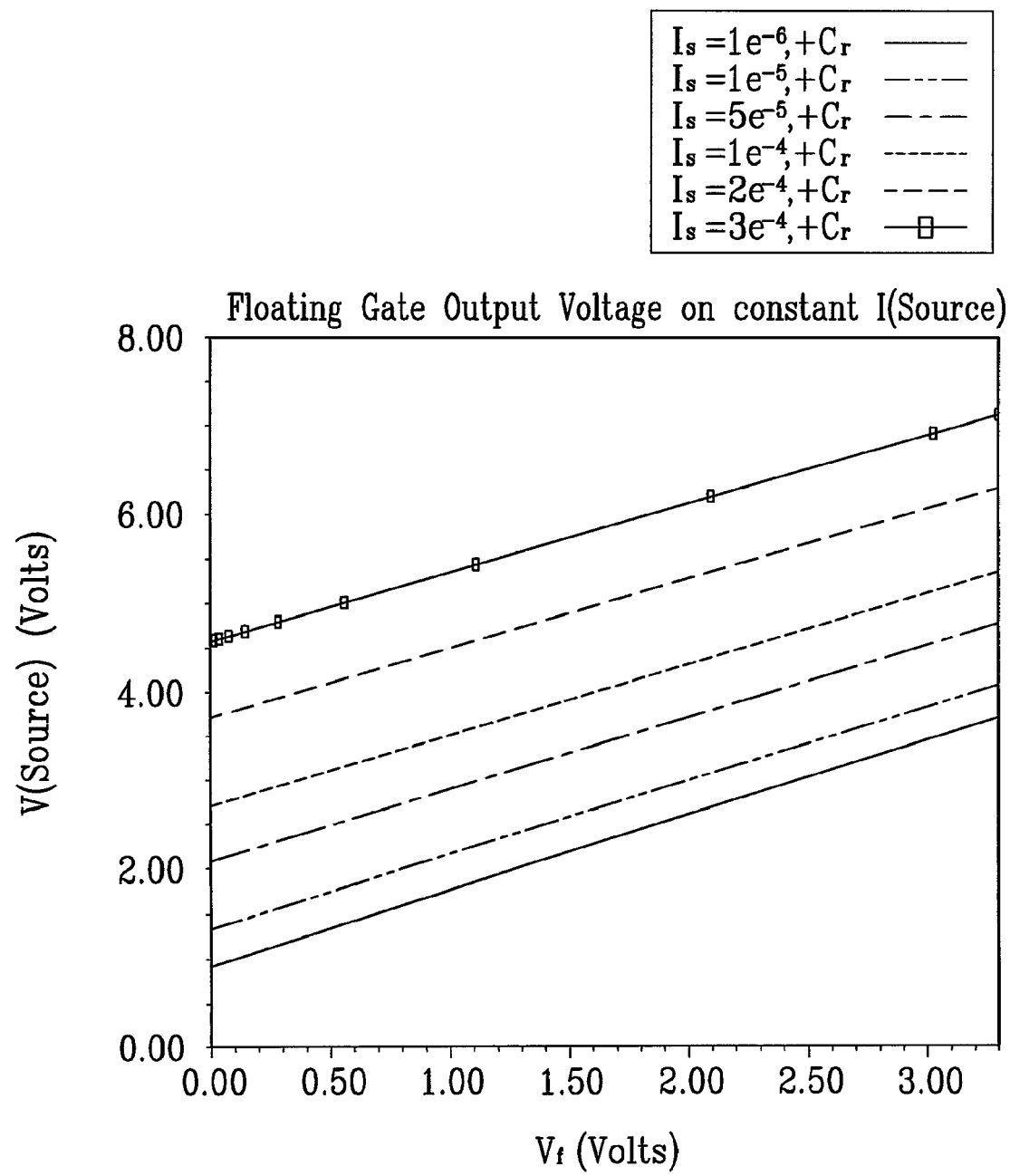
FIG. 3 is a graph showing the relationship between $V_s$–$V_f$ depending on $I_s$ when one terminal of an unknown capacitor is opened from the ground.

FIG. 3 is a graph showing the relationship between the voltage $V_s$ and the voltage $V_f$ when the capacitor $C_m$ is opened, that is, when the equivalent circuit of FIG. 2 is useful.

Figure 4:
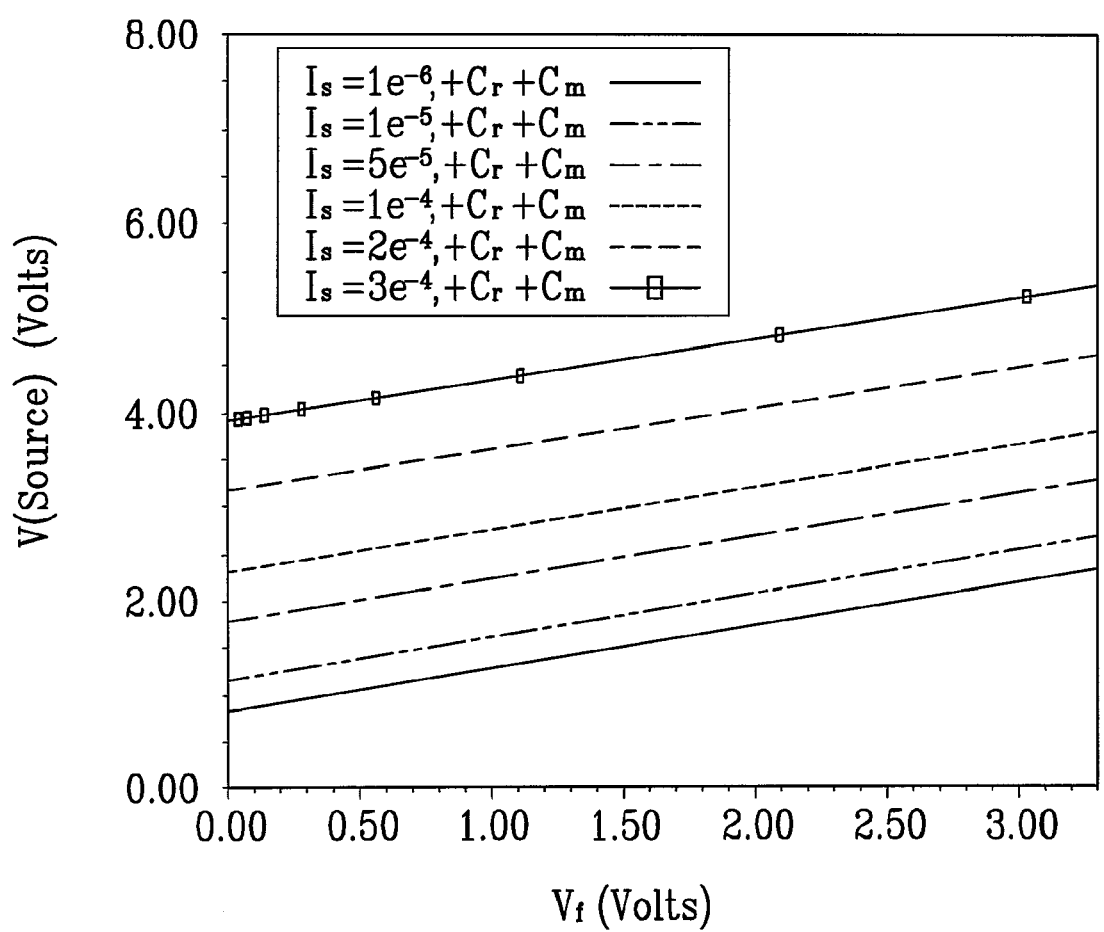
FIG. 4 is a graph showing the relationship between $V_s$–$V_f$ depending on $I_s$ when one terminal of unknown capacitances $C_{m1}$=$C_m$ is opened from the ground.

FIG. 4 is a graph showing the relationship between the voltage $V_s$ and the voltage $V_f$ when the capacitor $C_m$ is connected to the ground, that is, when the equivalent circuit of FIG. 1 is useful.

Figure 5:
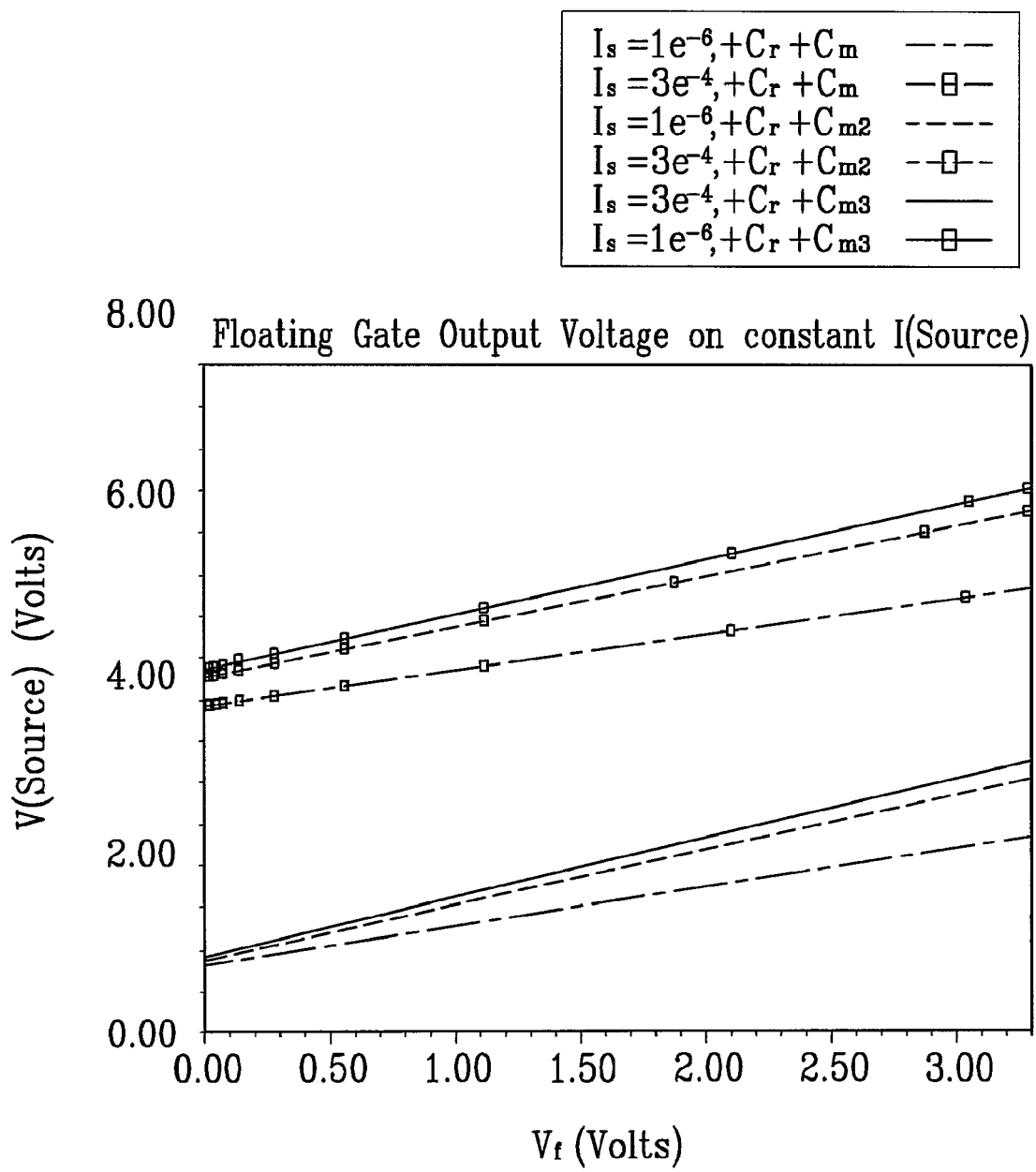
FIG. 5 is a graph showing the relationship between $V_s$–$V_f$ in the case of two $I_s$, that is, 1 $e^{-6}$ A/μm and 3 $e^{-4}$ A/μm.

From FIG. 5, it can be seen that whenever the value of the capacitor $C_m$ changes, the slope is varied in the relationship graph of the voltage $V_s$ and the voltage $V_f$. In the relationship graph between the voltage $V_s$ and the voltage $V_f$, the slope is slightly changed depending on the source current $I_s$ with respect to the same capacitance $C_m$.

Figure 6:
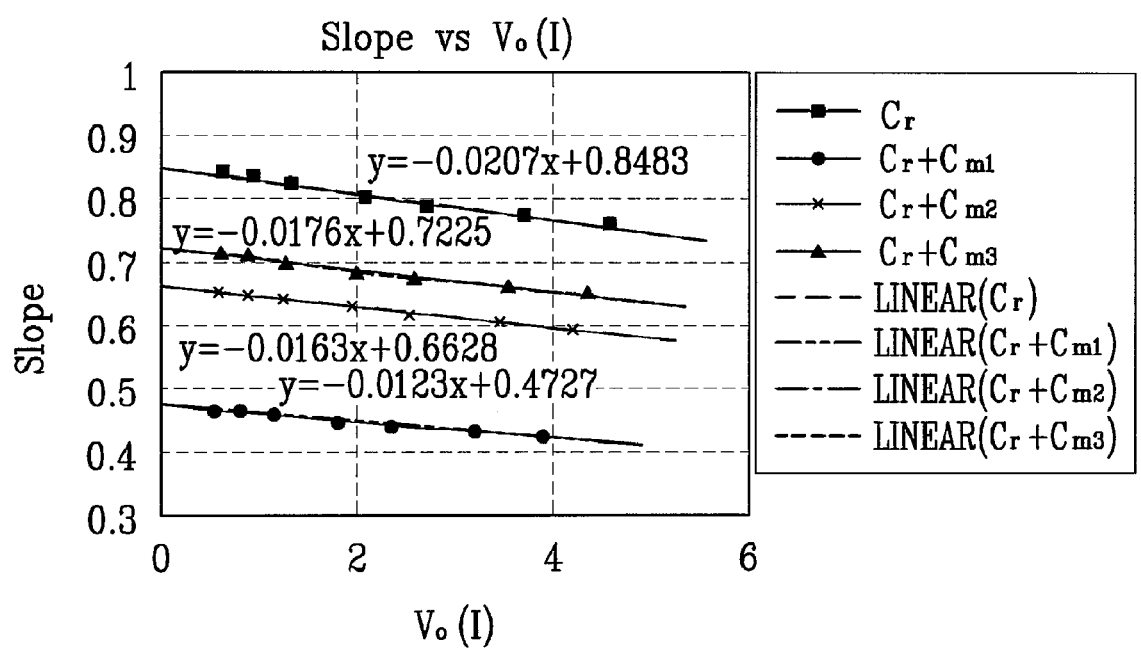
FIG. 6 is a graph showing the relationship between S–$V_o$(I) for extracting a standard slope.

Therefore, $V_o = 0$, that is, the intercept with the Y axis, which is found from the relationship graph of the slope S and $V_o(I_s)$ as in FIG. 6 by extracting the slope of $V_o(I_s)$ and $\Delta V_s/\Delta V_f$ when the voltage $V_f$ is 0 with respect to each source current $I_s$ is defined as the standard slope $S_n$.

Figure 7:
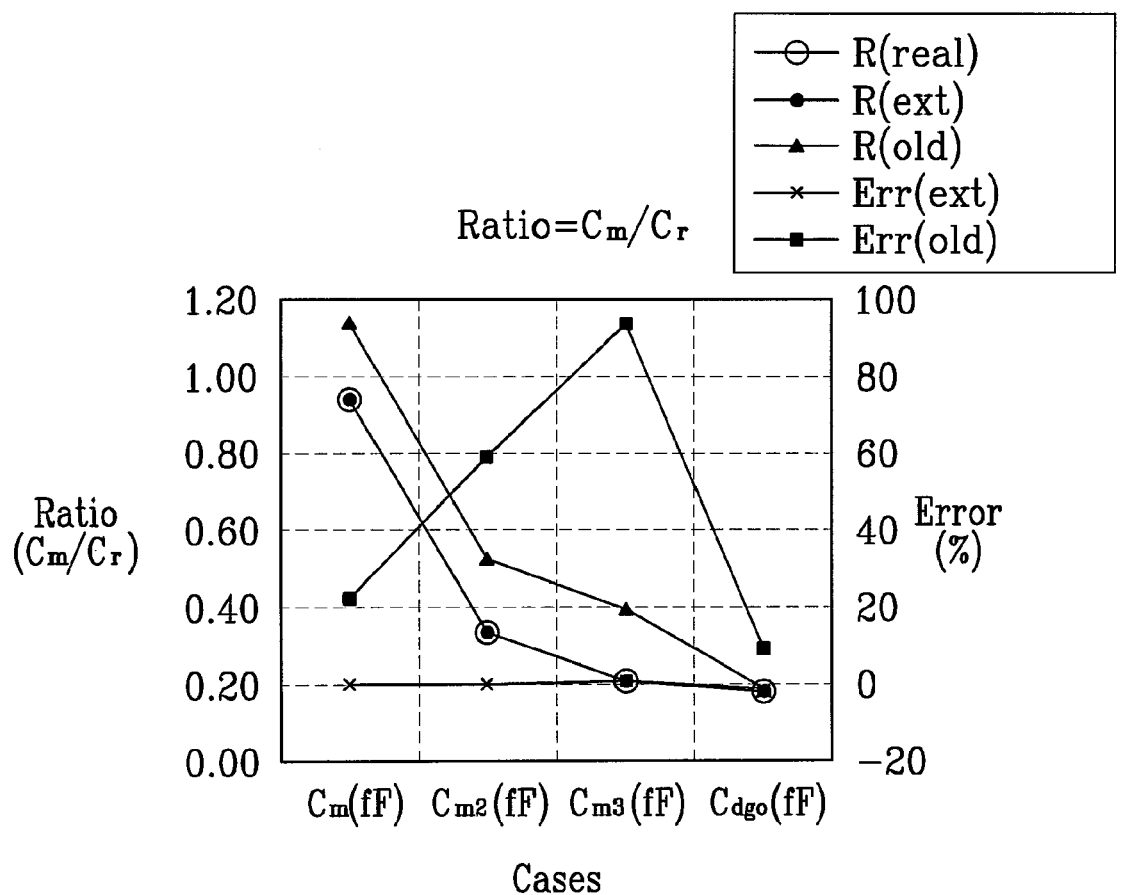
FIG. 7 is a graph showing the relationship between the $C_m/C_r$ ratio and an error value depending on each method.

FIG. 7 illustrates the comparison results of ratios in which the conventional method and the method of the present invention, and a case where actual values are used (Ratio)=$C_m/C_r$. From FIG. 7, it can be seen that the method of the present invention can remove error due to the gate-to-drain overlap capacitance $C_{dgo}$ and can extract error of 1% or less even in a very small capacitance region.

As described above, the present invention can minimize the effect of the gate-to-drain overlap capacitance when measuring an interconnect capacitance by using a reference capacitance and a source-flower MOSFET. Of course, a lower capacitance can be measured, measurement resolutions of a capacitor to be measured can be improved, and a test pattern area of a small MOSFET can be reduced. Furthermore, a MOSFET having a high overlap capacitance of a gate-drain/the gate-source can also be used for measurement.

Further, an overlap capacitance of the gate-drain and the gate-source can be measured.

Further, in accordance with the present invention, when a gate-to-drain overlap capacitance is known, an unknown capacitance connected to a floating gate can be measured based on the known gate-to-drain overlap capacitance.

Furthermore, according to the present invention, when two known capacitances are connected to a floating gate, a mismatching characteristic between the two capacitances can be analyzed.

While the invention has been shown and described with respect to the embodiments, it will be understood by those skilled in the art that various changes and modifications may be made without departing from the scope of the invention as defined in the following claims.

What is claimed is:

1. A capacitance measurement method employing a floating gate of a semiconductor device in a circuit having a MOSFET in which a drain is connected to a ground, and a source and a gate are connected to each other, and a capacitor having a capacitance $C_r$ connected to the gate, the method comprising the steps of:
    measuring a voltage $V_s$ of the source by applying a voltage $V_f$ to the capacitor in a state where a static current $I_s$ is applied to the source of the MOSFET;
    setting the voltage $V_s$ when the voltage $V_f$ is zero to $V_o(I_s)$, and obtaining a slope S from a relationship between the voltage $V_s$ and the voltage $V_f$;
    setting a standard slope $S_0$ as a y-intercept of a first-order linear equation obtained from a relationship between the slope S depending on the source current $I_s$ and the $V_o(I_s)$; and
    calculating a gate-to-drain overlap capacitance $C_{dgo}$ of the MOSFET based on a capacitance $C_r$ of the capacitor and the standard slope $S_0$,
    wherein the gate-to-drain overlap capacitance $C_{dgo}$ of the MOSFET is calculated from an equation:

$C_{dgo}=[(1-S_0)/S_0]*C_r$.

2. The capacitance measurement method of claim 1, wherein the slope S is calculated from an equation:

$S=\Delta V_s/\Delta V_f$.

3. A capacitance measurement method employing a floating gate of a semiconductor device in a circuit having a MOSFET in which a drain is connected to a ground, and a source and a gate are connected to each other, a reference capacitor having a capacitance $C_r$ connected to the gate, and a measurement capacitor having a capacitance $C_m$ connected to the reference capacitor, wherein a node between the reference capacitor and one end of the measurement capacitor is connected to the gate of the MOSFET, and the other end of the measurement capacitor is connected to the ground, the method comprising the steps of:
    measuring a voltage $V_s$ of the source by applying a voltage $V_f$ to the reference capacitor to which the measurement capacitor is connected in a state where a static current $I_s$ is applied to the source of the MOSFET;
    setting the voltage $V_s$ when the voltage $V_f$ is zero to $V_o(I_s)$, and obtaining a slope S from a relationship between the voltage $V_s$ and the voltage $V_f$;
    setting a standard slope $S_1$ as a y-intercept of a first-order linear equation obtained from a relationship between the slope S depending on the source current $I_s$ and the $V_o(I_s)$;
    removing the measurement capacitor from the circuit;
    measuring a voltage $V_s'$ of the source by applying the voltage $V_f$ to the reference capacitor in a state where the static current $I_s$ is applied to the source of the MOSFET;
    setting the voltage $V_s'$ when the voltage $V_f$ is zero to $V_o'(I_s)$, and obtaining a slope S' from a relationship between the voltage $V_s'$ and the voltage $V_f$;
    setting a standard slope $S_0$ as a y-intercept of a first-order linear equation obtained from a relationship between the slope S' depending on the source current $I_s$ and the $V_o'(I_s)$; and
    calculating the capacitance $C_m$ of the measurement capacitor,
    wherein the step of calculating the capacitance $C_m$ of the measurement capacitor includes:
    calculating a gate-to-drain overlap capacitance $C_{dgo}$ of the MOSFET; and
    calculating the capacitance $C_m$ of the measurement capacitor based on the standard slope $S_1$ and the gate-to-drain overlap capacitance $C_{dgo}$ of the MOSFET.

4. The capacitance measurement method of claim 3, wherein the slopes S and S', respectively, are calculated from equations:

$S=\Delta V_s/\Delta V_f$; and $S'=\Delta V_s'/\Delta V_f$.

5. The capacitance measurement method of claim 3, wherein the capacitance $C_m$ of the measurement capacitor is calculated based on the standard slopes $S_1$ and $S_o$ from an equation:

$C_m=(1/S_1-1/S_o)*C_r$.

6. The capacitance measurement method of claim 3, wherein the gate-to-drain overlap capacitance $C_{dgo}$ of the MOSFET is calculated from an equation:

$C_{dgo}=[(1-S_0)/S_0]*C_r$.

7. The capacitance measurement method of claim 3, wherein the capacitance $C_m$ of the measurement capacitor is calculated from an equation:

$C_m=[(1-S_1)/S_1]*C_r-C_{dgo}$.

* * * * *